US010474110B1

(12) United States Patent
Horovitz et al.

(10) Patent No.: US 10,474,110 B1
(45) Date of Patent: Nov. 12, 2019

(54) ADAPTIVE TIME-TO-DIGITAL CONVERTER AND METHOD

(71) Applicant: Intel Corporation, Santa Clara, CA (US)

(72) Inventors: Gil Horovitz, Emek-Hefer (IL); Aryeh Farber, Petah Tikva (IL); Nisim Machluf, Ashkelon (IL); Evgeny Shumaker, Nesher (IL); Igal Kushnir, Hod-Hasharon (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/229,638

(22) Filed: Dec. 21, 2018

(51) Int. Cl.
*G04F 10/00* (2006.01)
*H03L 7/083* (2006.01)
*H03L 7/095* (2006.01)
*H03L 7/08* (2006.01)

(52) U.S. Cl.
CPC ............ *G04F 10/005* (2013.01); *H03L 7/083* (2013.01); *H03L 7/095* (2013.01); *H03L 7/0802* (2013.01)

(58) Field of Classification Search
None
See application file for complete search history.

(56) References Cited

U.S. PATENT DOCUMENTS

| 7,973,578 | B2 * | 7/2011 | Oh | G04F 10/005 327/149 |
| 8,471,754 | B2 * | 6/2013 | Yamamoto | G01R 31/31709 341/155 |
| 10,108,148 | B1 * | 10/2018 | Testi | G04F 10/005 |

* cited by examiner

*Primary Examiner* — Jeffery S Zweizig
(74) *Attorney, Agent, or Firm* — Eschweiler & Potashnik, LLC

(57) ABSTRACT

Systems, methods, and circuitries are disclosed for controlling an adaptive time-to-digital converter (TDC) that determines a phase difference between a reference signal and a phase locked loop (PLL) feedback signal. Adaptive TDC circuitry includes a chain of n delay elements each characterized by an incremental delay. Gate circuitry outputs a gated PLL feedback signal while a gating enable signal has an enable value. N sampling elements, each associated with a delay element, are enabled by the reference signal arriving at the input of the associated delay element to store a value of the gated PLL feedback signal. Adaptive gating circuitry is configured to generate the gating enable signal based on the incremental delay and a period of the PLL feedback signal. A supply voltage for the delay elements may be controlled to cause the delay elements to exhibit a desired incremental delay.

26 Claims, 5 Drawing Sheets

ADAPTIVE TIME-TO-DIGITAL CONVERTER AND METHOD

BACKGROUND

Time-to-digital converters (TDCs) are employed in digital phase-locked loops (DPLLs) to quantify the relative phase between the local oscillator (LO) output (usually a high frequency signal) and a reference clock (usually a low frequency signal). The quantization is obtained in the TDC by measuring the relative time between a signifying event in the LO output signal and a signifying event in the reference clock signal, such as selected rising/falling edges of the signals.

DESCRIPTION

Figure 1:
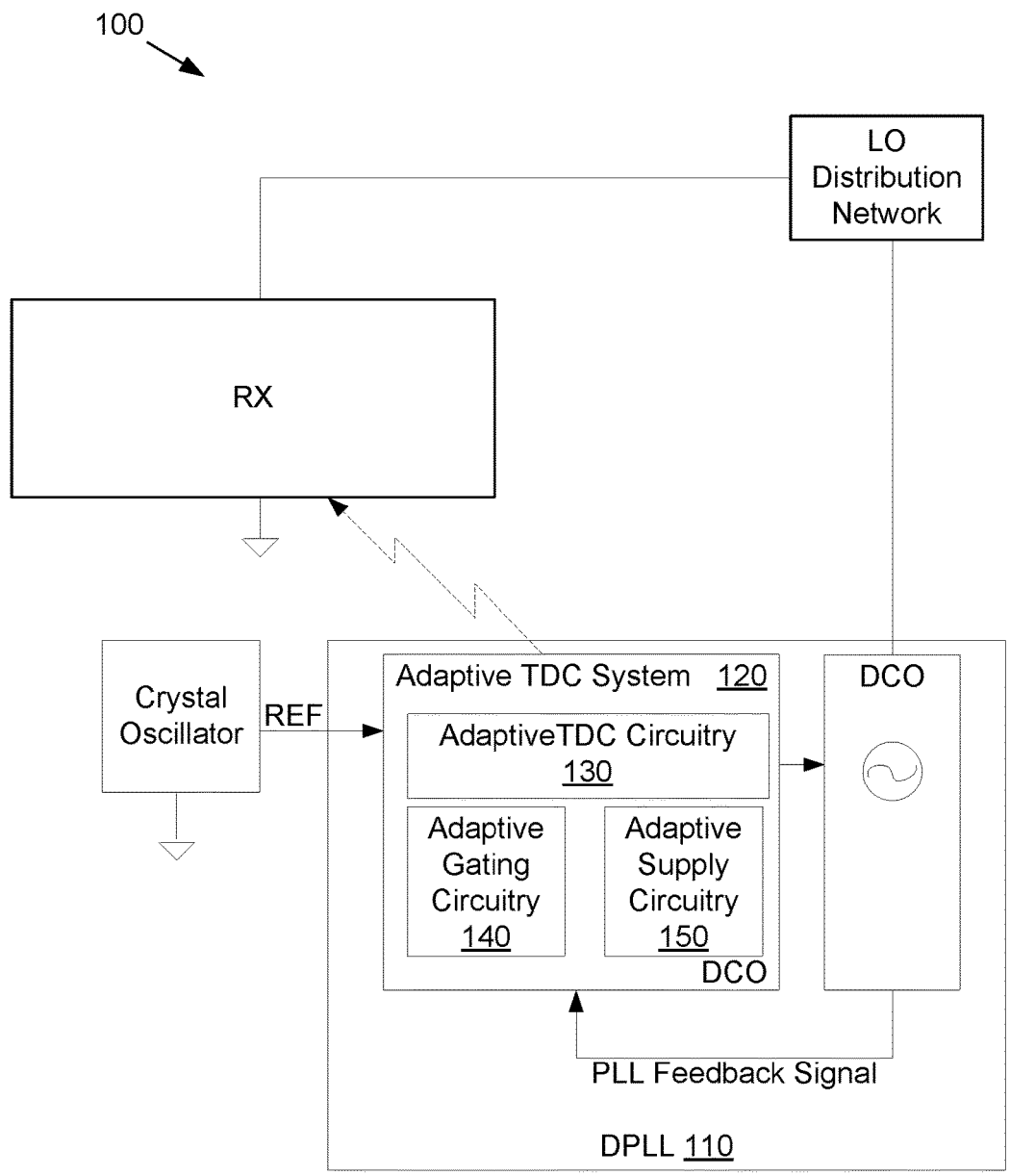
FIG. 1 illustrates an exemplary transceiver that includes an adaptive TDC system in accordance with various aspects described.

FIG. 1 illustrates an exemplary transceiver system 100 that includes a DPLL 110 that generates an LO signal for distribution on an LO distribution network to a receiver (RX) and/or a transmitter (TX) (not shown). The DPLL 110 receives a reference signal REF from a crystal oscillator circuit and controls a DCO (or other oscillator circuitry) to generate a desired LO signal that is in phase with the reference signal. To control the DCO, the DPLL 110 feeds back a PLL feedback signal to an adaptive TDC system 120. The adaptive TDC system 120 is capable of modifying a gating signal used to define a transparency window in a manner that minimizes current consumption and modifying a TDC supply voltage to adjust the range of signal frequencies that can be measured by the adaptive TDC system 120.

The adaptive TDC system 120 serves as a phase detector that determines a difference in phase between the reference signal and the PLL feedback signal. As used herein "PLL feedback signal" refers to any signal related to the LO signal that is fed back to a phase detector for the purposes of closed loop control in a PLL or a DPLL. The phase difference determined by the adaptive TDC system 120 is used to control the DCO to align the LO signal with the reference signal.

TDCs are often used as phase detectors in DPLLs. To effectively fulfill this goal, the TDC is required to cover at least one full cycle of the faster (LO) signal, which is specified by the operational frequency of the device that utilizes the LO signal. Specifically, the time-span quantified by the TDC is determined by the lowest frequency LO signal present in the system (featuring the longest period).

Among the many different types of TDCs available, Flash TDC is one of the most prolific thanks to its simplicity and robustness. This type of TDC includes a unidirectional chain of delay elements, which are devised to establish a quantifying time-grid. The number of delay elements required is dictated by the lowest occurring incremental delay exhibited by the delay elements, which is usually derived from the fastest production corner.

Modern communication and data processing systems pose an ever-increasing demand on the spectral purity of LO signals, which in turn calls for high resolution phase-quantization abilities. The desire for high resolution often translates into a Flash TDC having a physical length (the number of delay elements used) that is prohibitively high. The main drawback of long Flash TDCs is aggressive current consumption. This is because large periodic current spikes are generated by closely spaced (in time) toggling of all the delay elements and sampling elements, causing widespread supply modulations. Since the current consumption periodicity profile is dictated by the dynamics of the LO signal phase being quantized which in turn stems from the LO frequency fraction (non-integer part of $f_{LO}/f_{REF}$ division) these signals are often termed fractional spurs. One of the major impacts of such spurs is receiver desensitization resulting from their permeation into the receiver chain (as shown in FIG. 1). The coupling can be mediated by several mechanisms, most common among which are supply coupling and substrate. Fractional spurs also degrade phase quantization accuracy.

Described herein are systems, circuitries, and methods that embody an adaptive TDC system 120 devised to mitigate the current consumption and/or reduces the TDC physical length necessary to cover all operational frequencies while compensating for variation in delay element characteristics in different process corners. To these ends, the adaptive TDC system 120 includes adaptive gating circuitry 140 configured to gate the PLL feedback signal to minimize the "transparency window" during which the PLL feedback signal is toggling delay elements and sampling elements in adaptive TDC circuitry 130. The adaptive TDC system 120 also includes adaptive supply circuitry 150 configured to vary the supply voltage to adapt the incremental delay of delay elements in the adaptive TDC circuitry 130 to allow for fewer delay elements to cover a larger range of operational frequencies while compensating for different process corners.

The present disclosure will now be described with reference to the attached figures, wherein like reference numerals are used to refer to like elements throughout, and wherein the illustrated structures and devices are not necessarily drawn to scale. As utilized herein, terms "module", "component," "system," "circuit," "element," "slice," "circuitry," and the like are intended to refer to a set of one or more electronic components, a computer-related entity, hardware, software (e.g., in execution), and/or firmware. For example, circuitry or a similar term can be a processor, a process running on a processor, a controller, an object, an executable program, a storage device, and/or a computer with a processing device. By way of illustration, an application running on a server and the server can also be circuitry. One or more circuits can reside within the same circuitry, and circuitry can be localized on one computer and/or distributed between two or more computers. A set of elements or a set of other circuits can be described herein, in which the term "set" can be interpreted as "one or more."

As another example, circuitry or similar term can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, circuitry can be an apparatus that provides specific functionality through electronic components without mechanical parts; the electronic components can include one or more processors therein to execute executable instructions stored in computer readable storage medium and/or firmware that confer(s), at least in part, the functionality of the electronic components.

It will be understood that when an element is referred to as being "connected" or "coupled" to another element, it can be physically connected or coupled to the other element such that current and/or electromagnetic radiation (e.g., a signal) can flow along a conductive path formed by the elements. Intervening conductive, inductive, or capacitive elements may be present between the element and the other element when the elements are described as being coupled or connected to one another. Further, when coupled or connected to one another, one element may be capable of inducing a voltage or current flow or propagation of an electro-magnetic wave in the other element without physical contact or intervening components. Further, when a voltage, current, or signal is referred to as being "applied" to an element, the voltage, current, or signal may be conducted to the element by way of a physical connection or by way of capacitive, electro-magnetic, or inductive coupling that does not involve a physical connection.

As used herein, a signal that is "indicative of" a value or other information may be a digital or analog signal that encodes or otherwise communicates the value or other information in a manner that can be decoded by and/or cause a responsive action in a component receiving the signal. The signal may be stored or buffered in computer readable storage medium prior to its receipt by the receiving component and the receiving component may retrieve the signal from the storage medium. Further, a "value" that is "indicative of" some quantity, state, or parameter may be physically embodied as a digital signal, an analog signal, or stored bits that encode or otherwise communicate the value.

Use of the word example is intended to present concepts in a concrete fashion. The terminology used herein is for the purpose of describing particular examples only and is not intended to be limiting of examples. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

In the following description, a plurality of details is set forth to provide a more thorough explanation of the embodiments of the present disclosure. However, it will be apparent to one skilled in the art that embodiments of the present disclosure may be practiced without these specific details. In other instances, well-known structures and devices are shown in block diagram form rather than in detail in order to avoid obscuring embodiments of the present disclosure.

In addition, features of the different embodiments described hereinafter may be combined with each other, unless specifically noted otherwise.

Figure 2:
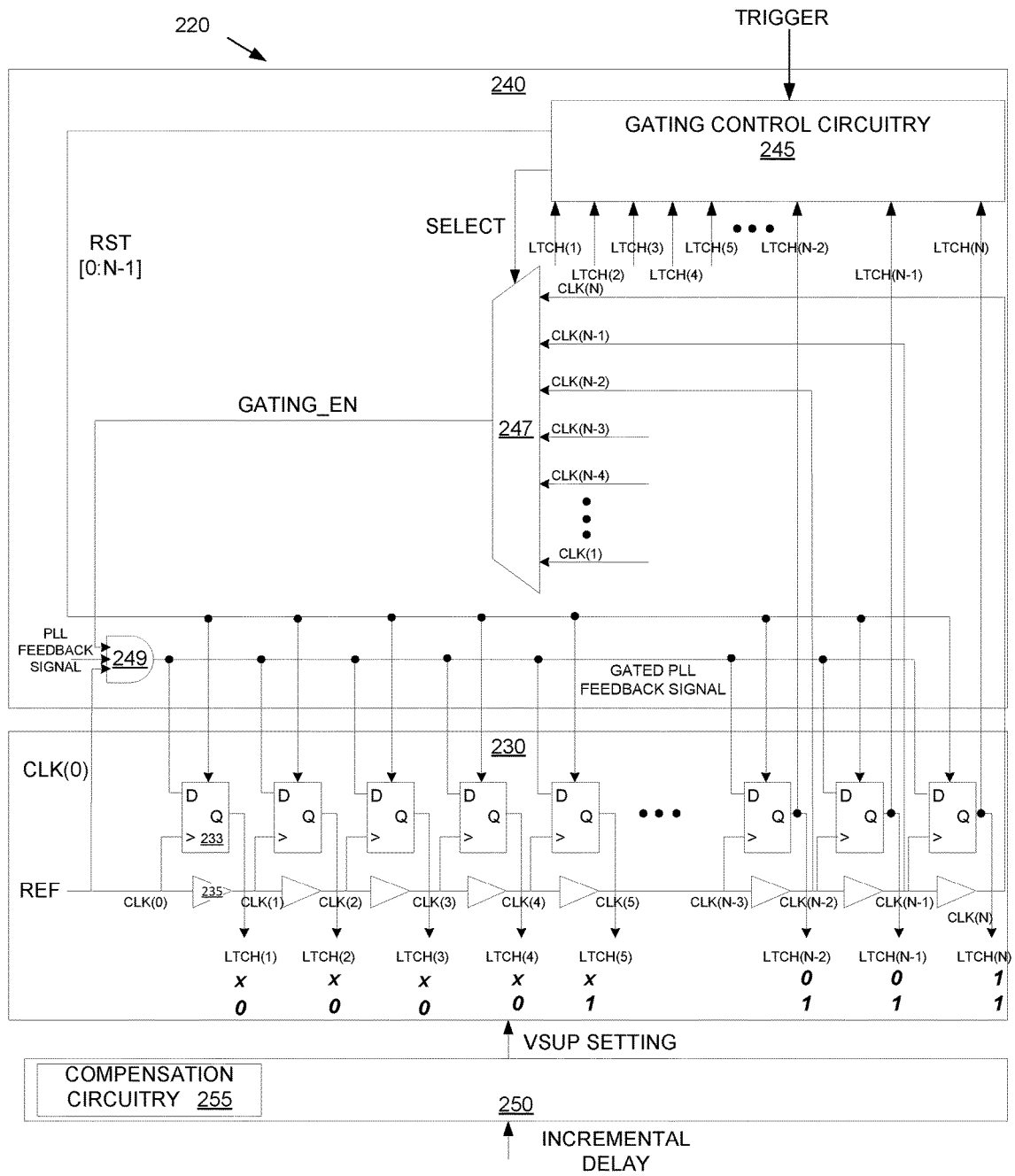
FIG. 2 illustrates an exemplary adaptive TDC system in accordance with various aspects described.

FIG. 2 illustrates an exemplary adaptive TDC system 220 that includes adaptive TDC circuitry 230, adaptive gating circuitry 240, and adaptive supply circuitry 250. The adaptive TDC circuitry 230 includes a chain of delay elements 235 and a corresponding sampling element 233 for each delay element. To quantify the phase delay between the reference signal and the PLL feedback signal, the reference signal is input to the chain of delay elements 235 and the reference signal is propagated through the chain as each delay element imparts an incremental delay on the reference signal. For clarity sake, the input/output of each delay element is designated by a unique CLK signal designation, which corresponds to the reference signal as delayed by the particular delay element and all prior delay elements in the chain. This means that when the reference signal has a logical value of 1, the CLK2 will have a logical 1 value one incremental delay time after the CLK1 takes on a logical 1 value. The delay elements 235 may be, for example, buffer circuits or inverter circuits.

Each sampling element 233 is enabled by the CLK signal of an immediately prior delay element to store the value of a gated PLL feedback signal output by gate circuitry 249. In this manner, each sampling element captures the value of the gated PLL feedback signal at some incremental time after a rising edge of the reference signal occurs. The sampling elements 233 may be, for example, D-type Master-Slave Flip-Flops. The incremental time for each sampling element is determined by the number of delay elements before the sampling element. Recall that due to different process corners, the incremental delay imparted by the delay elements may vary significantly due to process variation as well as operating conditions.

For simplicity, the n sampling elements 233 are illustrated and described as being individually associated with a unique delay element. However, in some examples, the n sampling elements are n sampling ensembles of elements (e.g., in stochastic quantizers) that may not be dedicated to individual delay elements. The term sampling element therefore should not be limited to the illustrated single sampling element connected to a single delay element.

FIG. 2 illustrates two partial sets of stored gated PLL feedback signal values, designated LTCH, for the same PLL feedback signal frequency. The first transition from a LTCH value of 0 to LTCH value of 1 corresponds to the first rising edge of the PLL feedback signal that should be aligned with the rising edge of the reference signal that triggers the quantization process. The top row of LTCH values are for a "fast" process corner in which the delay elements exhibit a short incremental delay. The bottom row of LTCH values are for a "slow" process corner in which the delay elements exhibit a long incremental delay. In the top row of LTCH values the first transition between 0 and 1 occurs between LTCH(N-1) and LTCH(N). This is due to the short incremental delay for each of the delay elements in the fast process corner. In the bottom row of LTCH values the first transition between 0 and 1 occurs between LTCH(4) and LTCH(5). This is due to the long incremental delay for each of the delay elements in the slow process corner. It can be seen that there is significant variation in the number of delay elements needed to detect the phase difference between the reference signal and the same PLL feedback signal. Thus long TDC circuitry (having many delay elements) is often used in circuit designs to cover the worst case scenario (fast process corner).

Figure 3:
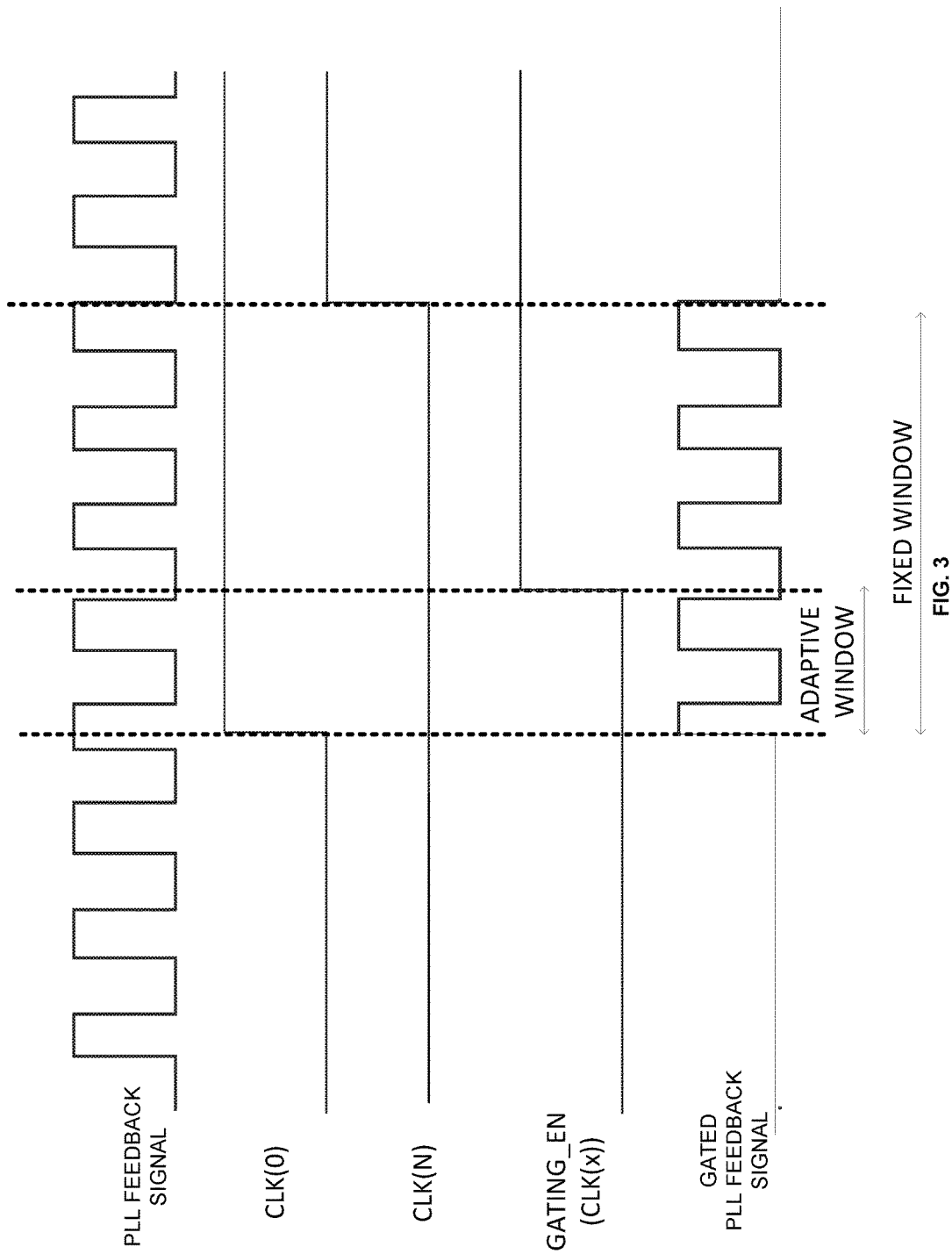
FIG. 3 illustrates an exemplary timing diagram for adaptive gating techniques in accordance with various aspects described.

One significant disadvantage to long TDC circuitry is the effect that the TDC length has on current consumption. As discussed above, aggressive current consumption occurs when the PLL feedback signal is toggling the sampling elements 233 during quantization. In some TDCs, rather than continuously providing the PLL feedback signal to the sampling elements, the PLL feedback signal is gated to define a fixed "transparency window" during which the PLL feedback signal is provided to the sampling elements. Outside the transparency window, some constant value is provided to the sampling elements to prevent the sampling elements from toggling thereby reducing current consumption. This fixed transparency window opens on a rising edge of the reference signal (CLK(0)) and closes on the CLK signal of the last delay element (CLK(N)). The fixed transparency window is illustrated in FIG. 3 in which the "fixed window" is open between the rising edge of CLK(0) and the rising edge of CLK(N) regardless of how many rising edges of the PLL feedback signal occur. Thus, in a slow process corner in which only a first portion of the delay elements are necessary to detect the phase difference, the TDC still suffers the current consumption incurred by some unnecessary delay elements/sampling elements that toggle after the rising edge of the DCO. Even in "normal" process corners there will some delay elements/sampling elements that are unnecessary and incur current consumption without providing a benefit.

To reduce current consumption, adaptive gating circuitry 240 shortens the transparency window when possible by determining how many delay elements should be used based on the present operational frequency and delay increment exhibited by the delay elements. To this end, rather than having a fixed transparency window that closes based on CLK(N), the adaptive gating circuitry 240 provides the CLK signal of a selected delay element to a gate circuitry 249 as the gating enable signal. When the gating enable signal has an enable value, the PLL feedback signal is provided to the sampling elements. In one example, the gate circuitry 249 is a logical AND circuit or gate that receives the reference signal (CLK(0)), the PLL feedback signal, and the gating enable signal. In this example, when the gating enable signal has the enable value (i.e., the gating enable signal is 1), the PLL feedback signal is provided by the gate circuitry 249 to the sampling elements. When the gating enable signal does not have the enable value (i.e., the gating enable signal is 0), a logical value of 0 is provided to the sampling elements.

The adaptive gating circuitry 240 includes gating control circuitry 245 that selects CLK signal that should be used as the gating enable signal. The gating control circuitry 245 analyzes the LTCH(1)-LTCH(N) values to select a delay element whose CLK signal should be used as the gating enable signal. During a calibration process, the gating control circuitry 240 causes CLK(N) to be used as the gating enable signal and, based on LTCH(1)-LTCH(N), determines the number of PLL feedback signal rising edges that were captured. Based on this information, the gating control circuitry 245 can determine how many delay elements are necessary to cover an entire period of the PLL feedback signal. If k elements are necessary to cover an entire period of the PLL feedback signal, the gating control circuitry may select CLK(k) or possibly CLK(k+m), where m is some safety factor.

The gating control circuitry generates a select signal that communicates which CLK signal should be used as the gating enable signal. In one example, the adaptive gating circuitry 240 includes a multiplexor 247 that inputs one or more of the CLK signals and, responsive to the select signal, outputs the CLK signal selected by the gating control circuitry 245 as the gating enable signal. FIG. 3 illustrates how the adaptive window created by selecting a CLK signal for closing the transparency window significantly reduces the transparency window and, in turn, power consumption. In addition, the gating control circuitry 245 sends out a reset signal that disables or "turns off" the sampling elements associated with delay elements that occur downstream of the selected delay element that outputs the selected CLK signal. This provides additional reduction in current consumption.

The gating control circuitry 245 performs the calibration or selection of subsequent gating enable signal automatically every so often in terms of time or quantization cycles and/or in response to some trigger signal. During calibration, the gating control circuitry 245 will remove the reset signal or "turn on" the sampling elements that were turned off in the previous calibration and analyze the LTCH(0)-LTCH(N) values to determine a next CLK signal that should be used as the gating enable signal. In some examples, the trigger signal may indicate that a temperature change has been sensed or that the device utilizing the LO signal has changed operational frequency.

Adaptive voltage supply circuitry 250 controls the supply voltage to the delay elements to cause the delay elements to exhibit a desired incremental delay. In general, as the supply voltage increases, the incremental delay of a delay element decreases. Adapting supply voltage provides additional flexibility in the adaptive TDC system 220 because it allows the same number of delay elements to cover a range of PLL feedback signal periods. The adaptive voltage supply circuitry 250 also enables the adaptive TDC circuitry 230 to include fewer delay elements. This is beneficial because the number of delay elements required for the TDC is dictated by the shortest occurring incremental delay, which is usually obtained at the fastest production corner, meaning that a long delay chain (featuring numerous sampling elements) is often created.

The number of delay elements for the adaptive TDC circuitry 230 can be selected accounting only for "slow" process corners where the number of TDC delay elements is minimal (as the incremental delay is the longest). Faster process corners that cause the delay elements to exhibit a shorter incremental delay can be compensated for by decreasing supply voltage. Employing this technique, the TDC delay line is kept to its minimum while preserving its resolution.

In one example the incremental delay exhibited by delay elements is a linear function of supply voltage. This "delay sensitivity" is approximately 7 fs/mV. To ensure coverage of an entire 4.8-6 GHz operational frequency range with 4 ps TDC coarse resolution, the TDC design should have $$\frac{1}{4.8 \text{ GHz} \times 4 \text{ pS}} = 52 \text{ delay elements}$$

(for a "typical" corner) to cover the minimum operational frequency. But for production robustness, the TDC design should account for the absolute worst case scenario, which occurs in a fast material where delay might be reduced down to 2.5 ps. In order to support the minimum frequency, it is required to extend the TDC length to have $$\frac{1}{4.8 \text{ GHz} \times 2.5 \text{ ps}} = 83 \text{ delay elements.}$$

This example represents a relatively extreme variation (4 ps-2.5 ps) in incremental delay for the sake of illustration. In many instances the variation in incremental delay due to process variation may be much smaller.

Since the adaptive supply voltage circuitry 250 enables control of the supply voltage to the delay elements, the TDC length can be designed based on the slowest corner (in which the delay is 5.5 ps) at a minimum supply voltage (~0.7V in the example process). Once the TDC is manufactured, the TDC delay can be adapted to accommodate the desired resolution. This means that the total TDC length needed, in this example, is $$\frac{1}{4.8 \text{ GHz} \times 5.5 \text{ ps}} = 38 \text{ delay elements.}$$

In general, using the techniques described herein reduces the TDC length as compared to TDCs that do not embody the described techniques.

The adaptive supply voltage circuitry 250 includes compensation circuitry 255 that receives an incremental delay for the delay elements in the TDC circuitry and compensates for the delay by determining how much to decrease the supply voltage at faster process corners in which the incremental delay is shorter. In one example, the incremental delay for delay elements in a given TDC can be deduced from a maximum code that can be output by the TDC. This information may be stored in a lookup table (LUT) associated with the DPLL. If the maximum code is high, then the incremental delay for the delay elements in the TDC is high. If the incremental delay is actually 2.5 ps, the compensation circuitry 255 determines or calculates that the supply voltage should be reduced by $$\left(\frac{5.5 \text{ ps} - 2.5 \text{ ps}}{7 \text{ fs/mv}}\right)$$

or approximately 430 mv (or down to 0.57V from 1.0V). The compensation circuitry may include hardware-based computational components that perform the calculation, and/or a lookup table that maps incremental delay to supply voltage. By using this adaptive supply voltage technique the size of the delay line can be cut by 54%. Alternatively, TDC design can be optimized for a typical value and then be compensated for slow and fast process corners by supply adjustment. By using this adaptive supply voltage technique, TDC quantization noise is kept constant over process variation.

Table 1 lists the actual number of delay elements required per process corner and frequency of operation for one example process.

TABLE 1

| Operational frequency | Slow (delay = 5.5 ps) | Typical (delay = 4 ps) | Fast (delay = 2.5 ps) |
| --- | --- | --- | --- |
| Min (4.8 GHz) | 38 | 52 | 83 |
| Max (6 GHz) | 29 | 40 | 64 |

As can be seen from Table 1, although a TDC would need to be designed with 83 delay elements in order to support the above operational frequency range under all process variations, in most cases (>90% of material) the required TDC length is considerably shorter. For typical incremental delay and the highest operational frequency, the actual required length is less than 50% of physical length implemented. For material that exhibits large incremental delay, only 35% of the delay elements in the TDC are actually used. This suggests that by applying adaptive gating and adaptive supply voltage techniques, both average power consumption as well as currents spikes may be reduced dramatically.

Figure 4A:
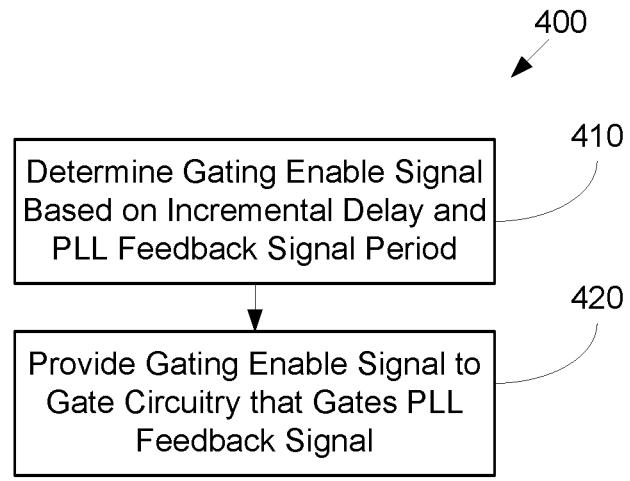
FIG. 4A illustrates an exemplary flow diagram of an exemplary method of adaptively controlling a transparency window for adaptive TDC circuitry in accordance with various aspects described.

FIG. 4A illustrates a flow diagram outlining an exemplary method 400 configured to control a time-to-digital converter (TDC) circuitry that includes a chain of n delay elements and a set of n sampling elements, each associated with a respective delay element. The TDC is configured to determine a phase difference between a reference signal and a digitally controlled oscillator (DCO) signal. The method 400 may be performed, for example, by adaptive gating circuitry 140, 240 of FIGS. 1 and 2, respectively. The method 400 includes, at 410, determining a gating enable signal based on an incremental delay for each delay element and a period of the PLL feedback signal. At 420 the gating enable signal is provided to gate circuitry that gates the PLL feedback signal, such that when the gating enable signal has an enable value the PLL feedback signal is provided to the n sampling elements and when the gating enable signal does not have the enable value a constant value is provided to the n sampling elements.

In one example, the method 400 also includes selecting a delay element based on the incremental delay and the PLL feedback signal period and generating the gating enable signal to have the enable value until the selected delay element outputs a clock signal.

In one example, the method 400 also includes disabling sampling elements downstream of a sampling element associated with a selected delay element.

In one example, the method 400 also includes controlling a supply voltage for the delay elements to cause the delay elements to exhibit a desired incremental delay.

Figure 4B:
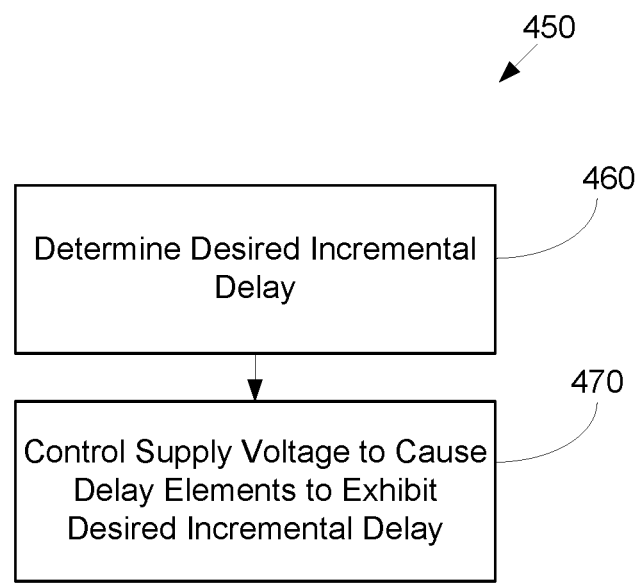
FIG. 4B illustrates an exemplary flow diagram of an exemplary method of adaptively controlling supply voltage for adaptive TDC circuitry in accordance with various aspects described.

FIG. 4B illustrates a flow diagram outlining an exemplary method 450 configured to control a time-to-digital converter (TDC) circuitry that includes a chain of n delay elements and a set of n sampling elements, each associated with a respective delay element. The TDC is configured to determine a phase difference between a reference signal and a digitally controlled oscillator (DCO) signal. The method 450 may be performed, for example, by adaptive supply circuitry 150, 250 of FIGS. 1 and 2, respectively. The method 450 includes, at 460, determining a desired incremental delay for the delay elements, wherein an incremental delay for a delay element corresponds to an amount of time that elapses between a time at which the reference signal is input to the delay element and a time at which the delay element outputs a respective clock signal. At 470 a supply voltage for the delay elements is controlled to cause the delay elements to exhibit the desired incremental delay.

In one example, the method 450 also includes determining a supply voltage that will cause the delay elements to exhibit the desired incremental delay based on a linear delay sensitivity relationship between supply voltage and incremental delay.

In one example, the method 450 also includes determining a gating enable signal based on an incremental delay for each delay element and a period of the PLL feedback signal and providing the gating enable signal to gate circuitry that gates the PLL feedback signal, such that when the gating enable signal has an enable value the PLL feedback signal is provided to the n sampling elements and when the gating enable signal does not have the enable value a constant value is provided to the n sampling elements.

In one example, the method 450 also includes selecting a delay element based on the incremental delay and the PLL feedback signal period and generating the gating enable signal to have the enable value until the selected delay element outputs a clock signal.

In one example, the method 450 also includes disabling sampling elements downstream of a sampling element associated with a selected delay element.

It can be seen from the foregoing description that the adaptive TDC systems, circuitries, and methods described herein maintain the minimum required active TDC length for a particular part and operational frequency while allowing the design to support robust operation over a wide range of frequencies and process conditions. The minimization of TDC length is important to reducing the aggressiveness of the current consumption thereby minimizing the incurred spur level. Alternately, under same current consumption, a longer TDC can be designed in order to cover larger range of frequencies.

Figure 5:
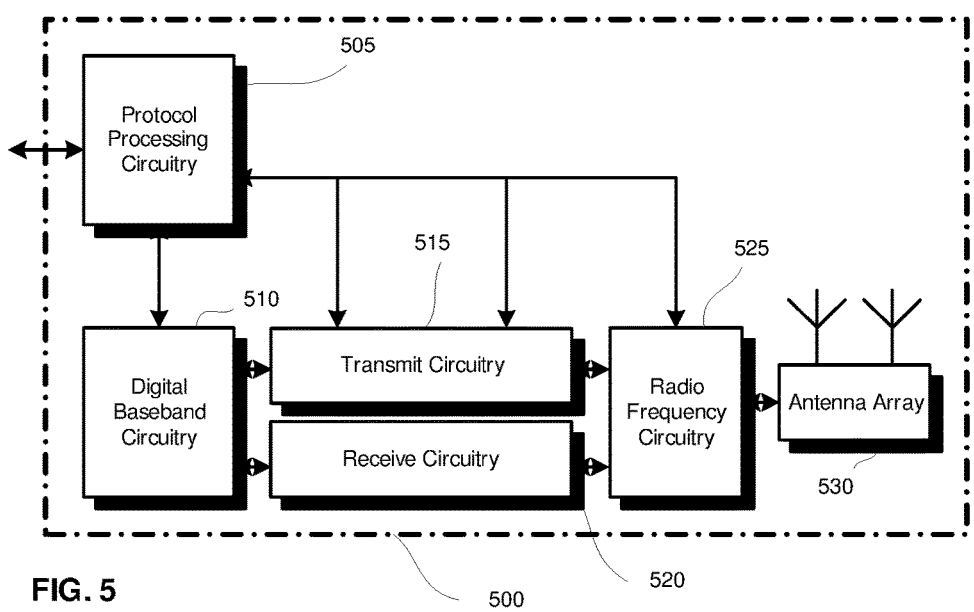
FIG. 5 illustrates an exemplary communication circuitry in accordance with various aspects described.

FIG. 5 illustrates an exemplary communication circuitry 500 according to some aspects. Circuitry 500 is alternatively grouped according to functions. Components as shown in 500 are shown here for illustrative purposes and may include other components not shown here in FIG. 5.

Communication circuitry 500 may include protocol processing circuitry 505, which may implement one or more of medium access control (MAC), radio link control (RLC), packet data convergence protocol (PDCP), radio resource control (RRC) and non-access stratum (NAS) functions. Protocol processing circuitry 505 may include one or more processing cores (not shown) to execute instructions and one or more memory structures (not shown) to store program and data information.

Communication circuitry 500 may further include digital baseband circuitry 510, which may implement physical layer (PHY) functions including one or more of hybrid automatic repeat request (HARQ) functions, scrambling and/or descrambling, coding and/or decoding, layer mapping and/or de-mapping, modulation symbol mapping, received symbol and/or bit metric determination, multi-antenna port pre-coding and/or decoding which may include one or more of space-time, space-frequency or spatial coding, reference signal generation and/or detection, preamble sequence generation and/or decoding, synchronization sequence generation and/or detection, control channel signal blind decoding, and other related functions.

Communication circuitry 500 may further include transmit circuitry 515, receive circuitry 520 and/or antenna array circuitry 530.

Communication circuitry 500 may further include radio frequency (RF) circuitry 525. In an aspect of the invention, RF circuitry 525 may include multiple parallel RF chains for one or more of transmit or receive functions, each connected to one or more antennas of the antenna array 530. One or more of these RF chains may receive an LO signal generated by a PLL that includes adaptive TDC circuitry as described in FIGS. 1-4.

In an aspect of the disclosure, protocol processing circuitry 505 may include one or more instances of control circuitry (not shown) to provide control functions for one or more of digital baseband circuitry 510, transmit circuitry 515, receive circuitry 520, and/or radio frequency circuitry 525.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

Examples can include subject matter such as a method, means for performing acts or blocks of the method, at least one machine-readable medium including instructions that, when performed by a machine cause the machine to perform acts of the method or of an apparatus or system for adapting the operation of a TDC according to embodiments and examples described herein.

Example 1 is an adaptive time-to-digital converter (TDC) system configured to determine a phase difference between a reference signal and a phase locked loop (PLL) feedback signal. The system includes adaptive TDC circuitry and adaptive gating circuitry. The adaptive TDC circuitry includes a chain of n delay elements each characterized by an incremental delay corresponding to an amount of time that elapses between a time at which the reference signal is input to the delay element and a time at which the delay element outputs a respective clock signal; gate circuitry that outputs a gated PLL feedback signal while a gating enable signal has an enable value; and n sampling elements, each associated with a delay element, wherein each sampling element is enabled by the reference signal arriving at the input of the associated delay element to store a value of the gated PLL feedback signal. The adaptive gating circuitry is configured to generate the gating enable signal based on the incremental delay and a period of the PLL feedback signal.

Example 2 includes the subject matter of example 1, including or omitting optional elements, wherein the adaptive gating circuitry is configured to select a delay element based on the incremental delay and the PLL feedback signal period and generate the gating enable signal to have the enable value until the selected delay element outputs a clock signal.

Example 3 includes the subject matter of example 2, including or omitting optional elements, including gating control circuitry configured to select the delay element for use in generating the gating enable signal based on the values of the gated PLL feedback signal stored in the sampling elements.

Example 4 includes the subject matter of example 3, including or omitting optional elements, wherein the adaptive gating circuitry includes a multiplexor that inputs the clock signals output by two or more of the delay elements and, responsive to a select signal, outputs a selected one of the clock signals as the gating enable signal; and wherein the gating control circuitry is configured to generate the select signal to control the multiplexor to output the clock signal that is output by the selected delay element.

Example 5 includes the subject matter of example 3, including or omitting optional elements, wherein the gating control circuitry is configured to disable sampling elements downstream of a sampling element associated with a selected delay element.

Example 6 includes the subject matter of example 3, including or omitting optional elements, wherein the gating control circuitry is configured to modify the gating enable signal to generate a subsequent gating enable signal in response to a trigger signal that is indicative of a temperature change.

Example 7 includes the subject matter of example 3, including or omitting optional elements, wherein the gating control circuitry is configured to modify the gating enable signal to generate a subsequent gating enable signal in response to a trigger signal that is indicative of a change in LO frequency.

Example 8 includes the subject matter of example 1, including or omitting optional elements, further including adaptive supply circuitry configured to control a supply voltage for the delay elements to cause the delay elements to exhibit a desired incremental delay.

Example 9 includes the subject matter of example 1, including or omitting optional elements, wherein n is selected based on a number of delay elements necessary to cover a period of a minimum operational frequency when the delay elements exhibit an incremental delay in response to being powered by a minimum supply voltage.

Example 10 is a method configured to control a time-to-digital converter (TDC) circuitry that includes a chain of n delay elements and a set of n sampling elements, each associated with a respective delay element, wherein the TDC is configured to determine a phase difference between a reference signal and a digitally controlled oscillator (DCO) signal. The method includes determining a gating enable signal based on an incremental delay for each delay element and a period of the PLL feedback signal and providing the gating enable signal to gate circuitry that gates the PLL feedback signal, such that when the gating enable signal has an enable value the PLL feedback signal is provided to the n sampling elements and when the gating enable signal does not have the enable value a constant value is provided to the n sampling elements.

Example 11 includes the subject matter of example 10, including or omitting optional elements, further including selecting a delay element based on the incremental delay and the PLL feedback signal period and generating the gating enable signal to have the enable value until the selected delay element outputs a clock signal.

Example 12 includes the subject matter of example 10, including or omitting optional elements, further including disabling sampling elements downstream of a sampling element associated with a selected delay element.

Example 13 includes the subject matter of example 10, including or omitting optional elements, further including controlling a supply voltage for the delay elements to cause the delay elements to exhibit a desired incremental delay.

Example 14 is an adaptive time-to-digital converter (TDC) system configured to determine a phase difference between a reference signal and a digitally controlled oscillator (DCO) signal including adaptive TDC circuitry and adaptive supply circuitry. The adaptive TDC circuitry includes a chain of n delay elements each characterized by an incremental delay corresponding to an amount of time that elapses between a time at which the reference signal is input to the delay element and a time at which the delay element outputs a respective clock signal and n sampling elements, each associated with a delay element, wherein each sampling element is enabled by the reference signal arriving at the input of the associated delay element to store a value of a gated PLL feedback signal. The adaptive supply circuitry is configured to control a supply voltage for the delay elements to cause the delay elements to exhibit a desired incremental delay.

Example 15 includes the subject matter of example 14, including or omitting optional elements, wherein the adaptive supply circuitry includes compensation circuitry configured to determine supply voltage that will cause the delay elements to exhibit the desired incremental delay based on a linear delay sensitivity relationship between the supply voltage and incremental delay.

Example 16 includes the subject matter of example 14, including or omitting optional elements, wherein n is selected based on a number of delay elements necessary to cover a period of a minimum operational frequency when the delay elements exhibit an incremental delay in response to being powered by a minimum supply voltage.

Example 17 includes the subject matter of example 14, including or omitting optional elements, further including gate circuitry that outputs the gated PLL feedback signal while a gating enable signal has an enable value and adaptive gating circuitry configured to generate the gating enable signal based on the incremental delay and a period of the PLL feedback signal.

Example 18 includes the subject matter of example 17, including or omitting optional elements, wherein the adaptive gating circuitry is configured to select a delay element based on the incremental delay and the PLL feedback signal period and generate the gating enable signal to have the enable value until the selected delay element outputs a clock signal.

Example 19 includes the subject matter of example 17, including or omitting optional elements, including gating control circuitry configured to select the delay element for use in generating the gating enable signal based on values of the gated PLL feedback signal stored in the sampling elements.

Example 20 includes the subject matter of example 19, including or omitting optional elements, wherein the adaptive gating circuitry includes a multiplexor that inputs the clock signals output by two or more of the delay elements and, responsive to a select signal, outputs a selected one of the clock signals as the gating enable signal. The gating control circuitry is configured to generate the select signal to control the multiplexor to output the clock signal that is output by the selected delay element.

Example 21 includes the subject matter of example 19, including or omitting optional elements, wherein the gating control circuitry is configured to disable sampling elements downstream of a sampling element associated with a selected delay element.

Example 22 is a method configured to control a time-to-digital converter (TDC) circuitry that includes a chain of n delay elements and a set of n sampling elements, each associated with a respective delay element, wherein the TDC is configured to determine a phase difference between a reference signal and a digitally controlled oscillator (DCO) signal. The method includes determining a desired incremental delay for the delay elements, wherein an incremental delay for a delay element corresponds to an amount of time that elapses between a time at which the reference signal is input to the delay element and a time at which the delay element outputs a respective clock signal and controlling a supply voltage for the delay elements to cause the delay elements to exhibit the desired incremental delay.

Example 23 includes the subject matter of example 22, including or omitting optional elements, further including determining a supply voltage that will cause the delay elements to exhibit the desired incremental delay based on a linear delay sensitivity relationship between supply voltage and incremental delay.

Example 24 includes the subject matter of example 22, including or omitting optional elements, further including determining a gating enable signal based on an incremental delay for each delay element and a period of the PLL feedback signal and providing the gating enable signal to gate circuitry that gates the PLL feedback signal, such that when the gating enable signal has an enable value the PLL feedback signal is provided to the n sampling elements and when the gating enable signal does not have the enable value a constant value is provided to the n sampling elements.

Example 25 includes the subject matter of example 24, including or omitting optional elements, further including selecting a delay element based on the incremental delay and the PLL feedback signal period and generating the gating enable signal to have the enable value until the selected delay element outputs a clock signal.

Example 26 includes the subject matter of example 22, including or omitting optional elements, further including disabling sampling elements downstream of a sampling element associated with a selected delay element.

Various illustrative logics, logical blocks, modules, and circuits described in connection with aspects disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine. The various illustrative logics, logical blocks, modules, and circuits described in connection with aspects disclosed herein can be implemented or performed with a general purpose processor executing instructions stored in computer readable medium.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature may have been disclosed with respect to only one of several implementations, such feature may be combined with one or more other features of the other implementations as may be desired and advantageous for any given or particular application. The use of the phrase "one or more of A, B, or C" is intended to include all combinations of A, B, and C, for example A, A and B, A and B and C, B, and so on.

What is claimed is:

1. An adaptive time-to-digital converter (TDC) system configured to determine a phase difference between a reference signal and a phase locked loop (PLL) feedback signal, comprising:
    adaptive TDC circuitry comprising:
        a chain of n delay elements each characterized by an incremental delay corresponding to an amount of time that elapses between a time during which the reference signal is input to the delay element and a time during which the delay element outputs a respective clock signal;
        a gate circuitry to output a gated PLL feedback signal while a gating enable signal has an enable value; and
        n sampling elements, wherein each of the n sampling elements is associated with a delay element and is enabled by the reference signal to store a value of the gated PLL feedback signal; and
        adaptive gating circuitry configured to generate the gating enable signal based on the incremental delay and a period of the PLL feedback signal.

2. The adaptive TDC system of claim 1, wherein the adaptive gating circuitry is configured to:
    select a delay element based on the incremental delay and the PLL feedback signal period; and
    generate the gating enable signal to have the enable value until the selected delay element outputs a clock signal.

3. The adaptive TDC system of claim 2, comprising gating control circuitry configured to select the delay element for use in generating the gating enable signal based on the values of the gated PLL feedback signal stored in the sampling elements.

4. The adaptive TDC system of claim 3, wherein the adaptive gating circuitry comprises:
    a multiplexor that inputs the clock signals output by two or more of the delay elements and, responsive to a select signal, outputs a selected one of the clock signals as the gating enable signal; and
    wherein the gating control circuitry is configured to generate the select signal to control the multiplexor to output the clock signal that is output by the selected delay element.

5. The adaptive TDC system of claim 3, wherein the gating control circuitry is configured to disable sampling elements downstream of a sampling element associated with a selected delay element.

6. The adaptive TDC system of claim 3, wherein the gating control circuitry is configured to modify the gating enable signal to generate a subsequent gating enable signal in response to a trigger signal that is indicative of a temperature change.

7. The adaptive TDC system of claim 3, wherein the gating control circuitry is configured to modify the gating enable signal to generate a subsequent gating enable signal in response to a trigger signal that is indicative of a change in LO frequency.

8. The adaptive TDC system of claim 1, further comprising adaptive supply circuitry configured to control a supply voltage for the delay elements to cause the delay elements to exhibit a desired incremental delay.

9. The adaptive TDC system of claim 8, wherein n is selected based on a number of delay elements necessary to cover a period of a minimum operational frequency when the delay elements exhibit an incremental delay in response to being powered by a minimum supply voltage.

10. A method configured to control a time-to-digital converter (TDC) circuitry that includes a chain of n delay elements and a set of n sampling elements, each associated with a respective delay element, wherein the TDC is configured to determine a phase difference between a reference signal and a digitally controlled oscillator (DCO) signal, the method comprising:
  determining a gating enable signal based on an incremental delay for each delay element and a period of a phase locked loop (PLL) feedback signal; and
  providing the gating enable signal to gate circuitry that gates the PLL feedback signal, such that when the gating enable signal has an enable value the PLL feedback signal is provided to the n sampling elements and when the gating enable signal does not have the enable value a constant value is provided to the n sampling elements.

11. The method of claim 10, further comprising:
  selecting a delay element based on the incremental delay and the PLL feedback signal period; and
  generating the gating enable signal to have the enable value until the selected delay element outputs a clock signal.

12. The method of claim 10, further comprising disabling sampling elements downstream of a sampling element associated with a selected delay element.

13. The method of claim 10, further comprising controlling a supply voltage for the delay elements to cause the delay elements to exhibit a desired incremental delay.

14. An adaptive time-to-digital converter (TDC) system configured to determine a phase difference between a reference signal and a digitally controlled oscillator (DCO) signal, comprising:
  adaptive TDC circuitry comprising:
    a chain of n delay elements each characterized by an incremental delay corresponding to an amount of time that elapses between a time at which the reference signal is input to the delay element and a time at which the delay element outputs a respective clock signal; and
    n sampling elements, each associated with a delay element, wherein each sampling element is enabled by the reference signal arriving at the input of the associated delay element to store a value of a gated PLL feedback signal; and
  adaptive supply circuitry configured to control a supply voltage for the delay elements to cause the delay elements to exhibit a desired incremental delay.

15. The adaptive TDC system of claim 14, wherein the adaptive supply circuitry comprises compensation circuitry configured to determine supply voltage that will cause the delay elements to exhibit the desired incremental delay based on a linear delay sensitivity relationship between the supply voltage and incremental delay.

16. The adaptive TDC system of claim 14, wherein n is selected based on a number of delay elements necessary to cover a period of a minimum operational frequency when the delay elements exhibit an incremental delay in response to being powered by a minimum supply voltage.

17. The adaptive TDC system of claim 14, further comprising:
  gate circuitry that outputs the gated PLL feedback signal while a gating enable signal has an enable value; and
  adaptive gating circuitry configured to generate the gating enable signal based on the incremental delay and a period of the PLL feedback signal.

18. The adaptive TDC system of claim 17, wherein the adaptive gating circuitry is configured to:
  select a delay element based on the incremental delay and the PLL feedback signal period; and
  generate the gating enable signal to have the enable value until the selected delay element outputs a clock signal.

19. The adaptive TDC system of claim 17, comprising gating control circuitry configured to select the delay element for use in generating the gating enable signal based on values of the gated PLL feedback signal stored in the sampling elements.

20. The adaptive TDC system of claim 19, wherein the adaptive gating circuitry comprises:
  a multiplexor that inputs the clock signals output by two or more of the delay elements and, responsive to a select signal, outputs a selected one of the clock signals as the gating enable signal; and
  wherein the gating control circuitry is configured to generate the select signal to control the multiplexor to output the clock signal that is output by the selected delay element.

21. The adaptive TDC system of claim 19, wherein the gating control circuitry is configured to disable sampling elements downstream of a sampling element associated with a selected delay element.

22. A method configured to control a time-to-digital converter (TDC) circuitry that includes a chain of n delay elements and a set of n sampling elements, each associated with a respective delay element, wherein the TDC is configured to determine a phase difference between a reference signal and a digitally controlled oscillator (DCO) signal, the method comprising:
  determining a desired incremental delay for the delay elements, wherein an incremental delay for a delay element corresponds to an amount of time that elapses between a time at which the reference signal is input to the delay element and a time at which the delay element outputs a respective clock signal; and
  controlling a supply voltage for the delay elements to cause the delay elements to exhibit the desired incremental delay.

23. The method of claim 22, further comprising determining a supply voltage that will cause the delay elements to exhibit the desired incremental delay based on a linear delay sensitivity relationship between supply voltage and incremental delay.

24. The method of claim 22, further comprising:
  determining a gating enable signal based on an incremental delay for each delay element and a period of a phase locked loop (PLL) feedback signal; and
  providing the gating enable signal to gate circuitry that gates the PLL feedback signal, such that when the gating enable signal has an enable value the PLL feedback signal is provided to the n sampling elements and when the gating enable signal does not have the enable value a constant value is provided to the n sampling elements.

25. The method of claim 24, further comprising:
selecting a delay element based on the incremental delay and the PLL feedback signal period; and
generating the gating enable signal to have the enable value until the selected delay element outputs a clock signal.

26. The method of claim 22, further comprising disabling sampling elements downstream of a sampling element associated with a selected delay element.

* * * * *